United States Patent [19]

Oishi et al.

[11] Patent Number: 5,707,730
[45] Date of Patent: Jan. 13, 1998

[54] ADHESIVE FOR SEMICONDUCTOR DEVICE AND REINFORCING MATERIAL USING THE SAME

[75] Inventors: Tadahiro Oishi; Akira Tezuka, both of Shizuoka, Japan

[73] Assignee: Tomoegawa Paper Co. Ltd., Tokyo, Japan

[21] Appl. No.: 593,891

[22] Filed: Jan. 30, 1996

Related U.S. Application Data

[63] Continuation-in-part of Ser. No. 359,651, Dec. 20, 1994, abandoned.

[30] Foreign Application Priority Data

Dec. 20, 1993 [JP] Japan ................................ 5-344843

[51] Int. Cl.$^6$ .............................. B32B 7/12; B32B 15/04
[52] U.S. Cl. ........................ 428/344; 428/349; 428/354; 428/355 EP; 428/355 N
[58] Field of Search ................................ 428/344, 355, 428/349, 354, 355 EP, 355 N

[56] References Cited

U.S. PATENT DOCUMENTS

| | | | |
|---|---|---|---|
| 4,162,931 | 7/1979 | Yeakey et al. | 156/331 |
| 5,084,525 | 1/1992 | Akutagawa et al. | 525/423 |
| 5,296,556 | 3/1994 | Frilart | 525/420.5 |
| 5,317,062 | 5/1994 | Yagi et al. | 525/438 |
| 5,439,986 | 8/1995 | Hosogane et al. | 525/423 |

OTHER PUBLICATIONS

Patent Abstracts of Japan, vol. 14, No. 156(E–0908), 26 Mar. 1990 & JP-A-02015644 (Tomoegawa Paper Co Ltd) 19 Jan. 1990; abstract.

Patent Abstract of Japan; vol. 17, No. 310 (E–1380), 14 Jun. 1993 & JP-A-05029398 (Tomoegawa Paper Co Ltd), 5 Feb. 1993; abstract.

Patent Abstracts of Japan; vol. 17, No. 310 (E–1380), 14 Jun. 1993 & JP-A-05029385 (Matsushita Electric Ind Co Ltd), 5 Feb. 1993; abstract.

Patent Abstracts of Japan; vol. 17, No. 310 (E–1380), 14 Jun. 1993 & JP-A-05029399 (Tomoegawa Paper Co Ltd.) 5 Feb. 1993; abstract.

Patent Abstracts of Japan; vol. 18, No. 20 (E–1489), 13 Jan. 1994 & JP-A-05259228 (Tomoegawa Paper Co Ltd) 8 Oct. 1993; abstract.

Patent Abstracts of Japan; vol. 18, No. 80 (E–1505), 9 Feb. 1994 & JP-A-05291356 (Tomoegawa Paper Co Ltd) 5 Nov. 1993; abstract.

*Primary Examiner*—Ana Woodward
*Attorney, Agent, or Firm*—Wenderoth, Lind & Ponack

[57] ABSTRACT

An adhesive for bonding a reinforcing sheet to a lead-formed surface of a tape carrier package used for forming a semiconductor device, the adhesive being a resin composition which constitutes an interlayer between the lead-formed surface and the reinforcing sheet, comprises a polyamide resin having an amine value of 3.0 to 50 and an epoxy resin, is free from peeling and foaming, undergoes sufficient softening and curing at a temperature lower than about 150° C., has high insulation reliability after cured, and has heat resistance against a temperature up to 260° C.

7 Claims, 1 Drawing Sheet

ADHESIVE FOR SEMICONDUCTOR DEVICE AND REINFORCING MATERIAL USING THE SAME

This application is a continuation-in-part of now abandoned application, Ser. No. 08/359,651.

FIELD OF THE INVENTION

The present invention relates to an adhesive for constituting an-interface (interlayer) between a lead-formed surface and a reinforcing sheet for a semiconductor device having the reinforcing sheet attached to the lead-formed surface of a tape carrier package (TCP) produced by a tape automated bonding (TAB) technique, and a reinforcing material for a semiconductor device, formed by stacking a layer of said resin composition on the reinforcing sheet. More specifically, it relates to an adhesive which is capable of completely covering a lead of a TCP at a temperature of 150° C. or lower at which a tin plating formed on the TCP lead-formed surface is not affected, and which is free from peeling from the TCP and foaming during the curing under heat, and a reinforcing material for a semiconductor device.

PRIOR ART OF THE INVENTION

With a recent increase in demands for semiconductor devices which are decreased in thickness and have a high mounting density, a TCP formed according to the TAB method is attracting attention. This thin semiconductor device is produced by providing a TAB tape in which a space for mounting a semiconductor (IC) chip is made by punching, adhesion-fixing a copper foil on the TAB tape, forming a photoresist, forming a circuit from the copper foil by etching treatment, electrically connecting inner leads to the semiconductor chip and using a liquid mold material to seal the components.

The above sealing with a liquid mold material is carried out by dropping a liquid mold material (epoxy resin/curing agent) with a dispenser, and then curing it under heat. The problem with the above sealing is that a sealed semiconductor device causes distortion due to a difference between the thermal expansion coefficient of the liquid mold material and that of the semiconductor chip, which affects the plainness of the lead to impair the accuracy of an outer lead bonding. For overcoming this accuracy impairment, there has been proposed a method in which a reinforcing sheet is stacked on the lead-formed surface of TCP through a resin such as an adhesive resin.

FIG. 1 schematically shows a conventional semiconductor device produced by using a TAB tape. In FIG. 1, numeral 1 indicates a TAB tape, numeral 2 indicates a semiconductor (IC) chip, numeral 3 indicates a mold resin, numeral 4 indicates a bump, numeral 5 indicates an inner lead, numeral 6 indicates an outer lead, and numeral 9 indicates a lead.

FIG. 2 schematically shows a semiconductor device in which a lead 9 formed of a copper foil is adhesion-fixed on a TAB tape 1 and a reinforcing sheet 8 is stacked on the lead 9 through an thin adhesive layer 7. The reinforcing sheet is formed of a metal or a non-metal.

In the semiconductor device using TAP tapes, shown in FIG. 2, the lead formed of a copper foil generally has a thickness of 10 to 40 µm. Therefore, the thin adhesive layer 7 is required to have a thickness to such an extent that the adhesive layer surface nearly reaches the level of the lead-formed surface in order to remove a height difference caused by the presence of the lead. Further, in most semiconductor devices for which a TAB tapes are used, the lead, inner lead and outer lead are generally plated with tin for preventing the oxidation of the copper lead and improving the adhesion strength of the lead to a bump. For this reason, it is undesirable to heat the device up to a temperature of about 150° C. or higher before it is mounted on a printed circuit board. From this viewpoint, the thin adhesive layer is required to be fully softened and cured at a temperature lower than about 150° C. However, when a resin composition is softened more than necessary, the reinforcing sheet is likely to peel off due to the distortion which the TCP undergoes due to stress relaxation when the resin composition is cured under heat after the reinforcing sheet is attached. Further, the plainness of the lead is liable to be impaired due to foaming caused by the evaporation of water contained in TCP. The thin adhesive layer 7 is also required to have high insulation reliability since it is directly stacked also on the lead of the semiconductor device. Further, the cured adhesive composition is required to have high heat resistance, heat resistance against a temperature of about 260° C., when the device is mounted on a printed circuit board by solder reflowing. On the other hand, the resin composition is required to be cured at a temperature lower than about 150° C. as is already described.

SUMMARY OF THE INVENTION

It is an object of the present invention to provide an adhesive for a semiconductor device having a reinforcing sheet stacked on a lead-formed surface of a tape carrier package, which is free from peeling and foaming, which undergoes sufficient softening and curing at a temperature lower than about 150° C., which has high insulation reliability after curing, which has heat resistance against a temperature up to 260° C., and which is used for constituting an interface between a lead-formed surface and a reinforcing sheet.

It is another object of the present invention to provide a reinforcing material for use in a semiconductor device, formed by stacking a thin sheet of the above adhesive on a reinforcing sheet.

According to the present invention, there is provided an adhesive for bonding a reinforcing sheet to a lead-formed surface of a tape carrier package used for forming a semiconductor device, the adhesive being a resin composition which constitutes an interlayer between the lead-formed surface and the reinforcing sheet and comprises a polyamide resin having an amine value of 3.0 to 50 and an epoxy resin.

According to the present invention, further, there is provided an adhesive for bonding a reinforcing sheet to a lead-formed surface of a tape carrier package used for forming a semiconductor device, the adhesive being a resin composition which further contains a phenolic resin in addition to the above polyamide resin having an amine value of 3.0 to 50 and the above epoxy resin.

According to the present invention, further, there is provided a reinforcing material for a tape carrier package for a semiconductor device, formed by stacking the above adhesive on a reinforcing sheet.

DETAILED DESCRIPTION OF THE INVENTION

Figure 1:
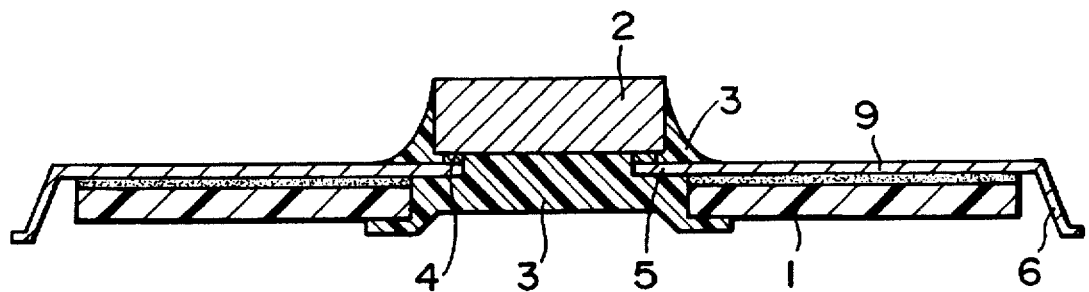
FIG. 1 shows a schematic cross section of a semiconductor device for which a TAB tape is used.
Figure 2:
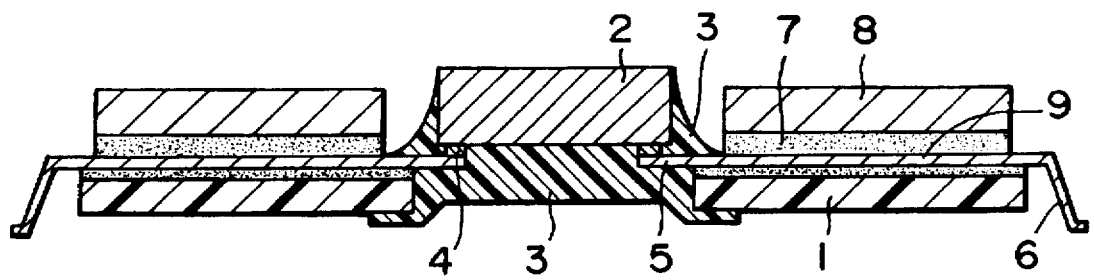
FIG. 2 shows a schematic cross section of a semiconductor device for which a TAB tape on which a reinforcing sheet is stacked is used.

The adhesive used in the present invention is used as a semi-cured, thermosetting adhesive which is cured in the state of B-stage. This composition is used for forming a thin layer having a thickness of 10 to 150 µm, preferably 30 to 100 µm, on a lead. The thickness of this thin layer is properly determined after lead heights and lead pitches are taken into consideration.

The adhesive comprises a polyamide resin and an epoxy resin. The epoxy resin works as a curing agent. The adhesive may further contain a phenolic resin, a polyimide resin and an acrylic resin as required.

The above polyamide resin may be any one of aliphatic polyamides and aromatic polyamides. The polyamide resin preferably has a weight average molecular weight, measured by a gel permeation chromatography method using polystyrene as a reference substance, of 2,000 to 150,000, a softening temperature, measured by a ball and ring method according to JIS k5902, of 50° to 180° C., and an amine value of 3.0 to 50, preferably 5 to 50. When the amine value is less than 3, the adhesive is liable to have problems in that it does not undergo sufficient curing and shows a low viscosity and peels when heat is applied, or that it undergoes foaming in a subsequent heat treatment. When the amine value exceeds 50, the curing proceeds too rapidly, and the covering of lead intervals with the adhesive is liable to be insufficient. The "amine value" refers to a weight (mg) KOH equivalent to an amine alkali present in 1 g of a sample. The amine value is determined by dissolving a polyamide resin in a toluene/n-butanol (1/1) mixed solution and neutrality-measuring the solution using a 0.5N hydrochloric acid aqueous solution by an indicator method.

The epoxy resin used as a curing agent for the polyamide resin includes bisphenol A glycidyl ether, epoxidized phenol novolak, epoxidized cresol novolak and various elastomer-modified epoxy resins such as acrylonitrile-butadiene rubber (NBR), styrene-butadiene rubber (SBR), butadiene rubber (BR) and silicone. The epoxy resin is generally used in an amount of 9 to 88 parts by weight per 100 parts by weight of the polyamide resin. When the amount of the epoxy resin is less than 9 parts by weight, the curing of the adhesive is insufficient. When this amount exceeds 88 parts by weight, the adhesive is defective in flexibility, which is an obstacle in a production step.

The adhesive of the present invention preferably contains an imidazole compound. The imidazole compound has the effect of increasing the reactivity of the epoxy resin and improving the heat resistance and chemical resistance of the adhesive. The imidazole compound includes imidazoles soluble in generally used solvents typified by methyl ethyl ketone, such as 2-methylimidazole and 2-ethyl-4-methylimidazole; and imidazoles slightly soluble in said generally used solvents, such as 2-phenyl-4-benzyl-5-hydroxymethylimidazole. The imidazole compound is generally used in an amount of 0.03 to 10.0 parts by weight per 100 parts by weight of the epoxy resin. When the amount of the imidazole compound is less than 0.03 part by weight, the effect on the promotion of reaction of the epoxy resin is poor. When it exceeds 10 parts by weight, it is liable to be difficult to keep the adhesive in B-stage, and the insulation by the adhesive is likely to be defective.

The adhesive of the present invention may further contain a phenolic resin. The phenolic resin includes novolak phenolic resins such as an alkyl phenolic resin, a p-phenyl phenolic resin and a bisphenol A type phenolic resin and others such as a resol phenolic resin and a polyphenyl p-phenolic resin. The phenolic resin is preferably used in an amount of 5 to 60 parts by weight per 100 parts by weight of the polyamide resin. When the amount of the phenolic resin is less than 5 parts by weight, the adhesive is liable to show decreased adhesion strength. When it exceeds 60 parts by weight, it is difficult to keep the adhesive in B-stage.

The adhesive of the present invention may contain an elastomer so that it is imparted with tenacity. The elastomer includes polyamide elastomers, NBR elastomers, acrylic elastomers, polyurethane elastomers, polyester elastomers and polyolefin elastomers. Further, the adhesive of the present invention may contain an inorganic or organic filler for controlling the thermal expansion coefficient and improving the processability. The inorganic filler includes silica, alumina, zinc oxide and silicon nitride. The organic filler includes nylon, polyimide and silicone. The filler is generally used in an amount of 5 to 95 parts by weight, preferably 20 to 50 parts by weight, per 100 parts by weight of the resin.

Figure 3:
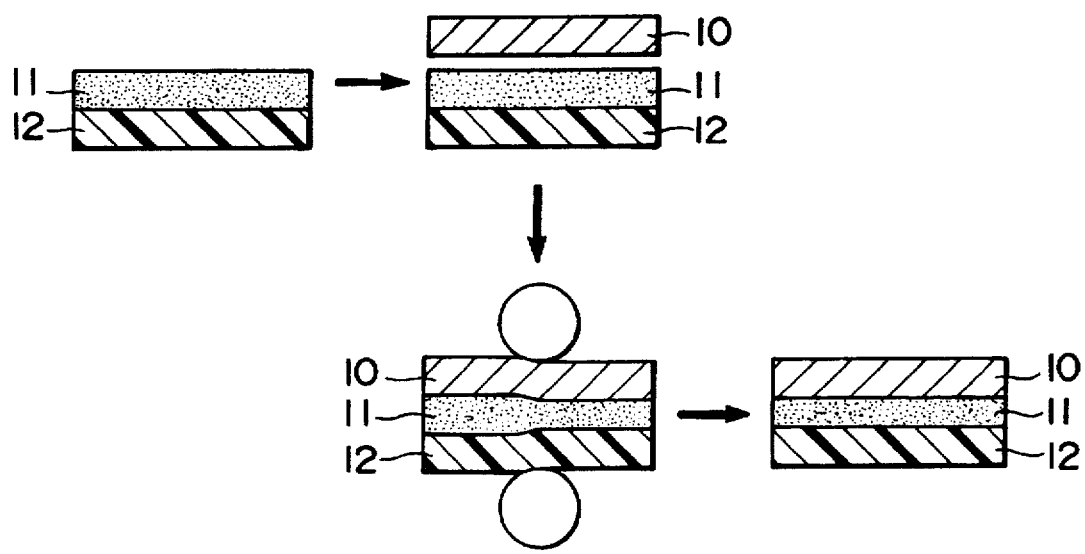
FIG. 3 shows steps for producing a reinforcing material for a semiconductor device.

A reinforcing material for a semiconductor device, using a semi-cured, thermosetting adhesive, for stacking a reinforcing sheet on the lead-formed surface of a TCP, will be explained hereinafter. FIG. 3 schematically shows steps of producing the reinforcing material. The adhesive is applied onto a protection film 12 such that it forms a layer having a predetermined thickness, generally, a dry thickness of 10 to 40 µm, to form a thin film 11. In this case, the adhesive is generally dried at a temperature between 100° and 180° C. for about 2 minutes. For forming a layer having a larger thickness than the above-specified, thin films obtained as above may be attached. Further, the thin film may be further aged at 40° to 120° C. for obtaining a proper semi-cured state. Then, a reinforcing sheet 10 is stacked on the thin film 11 of the adhesive of the semi-cured thermosetting resin composition and attached generally under heat at 100° to 130° C. under a pressure of at least 1 kg/cm². A laminate of the above thin film 11 and the reinforcing sheet 10 is, for example, taken up in the form of a roll having a width of 20 to 50 mm and a laminate length of 30 to 300 mm. The above laminate may be prepared in the form of a rectangular-shaped product having a width of 20 to 50 mm and a length of 10 to 100 cm.

The reinforcing sheet 10 is preferably selected from metal foils to exhibit the moisture absorption prevention, improvement in heat releasing and ground plane function for the semiconductor device. The thickness of the metal foil is 1 to 1,000 µm, preferably 10 to 260 µm. The metal foil includes a copper foil, a an aluminum foil, a molybdenum alloy foil, a stainless steel foil, a cupronickel foil and a beryllium foil.

The present invention will be explained more in detail hereinafter with reference to Examples, in which "%" and "part" stand for "% by weight" and "part by weight" unless otherwise specified.

EXAMPLE 1

An adhesive of a semi-cured thermosetting resin composition containing the following components was applied to a releasable film of polyethylene terephthalate having a thickness of 38 µm, and dried at 150° C. for 2 minutes to obtain a thin film of the semi-cured thermosetting adhesive, having a thickness of 20 µm.

| | |
|---|---|
| Solution of 25% of a polyamide resin ("Tohmide #1350, Mw = 37,000, softening point = 152° C., amine value = 10, supplied by Fuji Kasei Kogyo K.K.) in an isopropyl alcohol/toluene mixed solvent | 500 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

Another thin film was prepared in the same manner as above. These two thin films were stacked by attaching the adhesive sides thereof to each other to form a thin film having a thickness of 40 μm. The so-prepared thin film was aged at 80° C. for 24 hours to adjust its semi-cured state to give a thin film of the semi-cured thermosetting adhesive according to the present invention. The polyethylene terephthalate film on one side was peeled off, and the exposed adhesive surface and a reinforcing sheet of a 200 μm thick copper foil were attached. The resultant laminate was pressed under heat at 120° C. under a pressure of 1 kg/cm² to give a reinforcing material for a semiconductor device.

EXAMPLE 2

A thin film of a semi-cured thermosetting adhesive and a reinforcing material for a semiconductor device were prepared in the same manner as in Example 1 except that the semi-cured thermosetting resin composition was replaced with a semi-cured thermosetting resin composition containing the following components.

| | |
|---|---|
| Solution of 25% of a polyamide resin ("Tohmide #1360, Mw = 45,000, softening point = 170° C., amine value = 5, supplied by Fuji Kasei Kogyo K.K.) in an isopropyl alcohol/toluene mixed solvent | 500 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

COMPARATIVE EXAMPLE 1

A comparative thin film of a semi-cured thermosetting adhesive and a comparative reinforcing material for a semiconductor device were prepared in the same manner as in Example 1 except that the semi-cured thermosetting resin composition was replaced with a semi-cured thermosetting resin composition containing the following components.

| | |
|---|---|
| Solution of 25% of a polyamide resin ("Tohmide #394, Mw = 28,000, softening point = 110° C., amine value = 2, supplied by Fuji Kasei Kogyo K.K.) in an isopropyl alcohol/toluene mixed solvent | 300 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

COMPARATIVE EXAMPLE 2

A comparative thin film of a semi-cured thermosetting adhesive and a comparative reinforcing material for a semiconductor device were prepared in the same manner as in Example 1 except that the semi-cured thermosetting resin composition was replaced with a semi-cured thermosetting resin composition containing the following components.

| | |
|---|---|
| Solution of 25% of a polyamide resin ("Tohmide #535, Mw = 34,000, softening point = 135° C., amine value = 55, supplied by Fuji Kasei Kogyo K.K.) in an isopropyl alcohol/toluene mixed solvent | 300 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

COMPARATIVE EXAMPLE 3

A comparative thin film of a semi-cured thermosetting adhesive and a comparative reinforcing material for a semiconductor device were prepared in the same manner as in Example 1 except that the semi-cured thermosetting resin composition was replaced with a semi-cured thermosetting resin composition containing the following components.

| | |
|---|---|
| Solution of 25% of a polyamide resin ("Tohmide #1350, amine value = 10, supplied by Fuji Kasei Kogyo K.K.) in an isopropyl alcohol/toluene mixed solvent | 300 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

COMPARATIVE EXAMPLE 4

A comparative thin film of a semi-cured thermosetting adhesive and a comparative reinforcing material for a semiconductor device were prepared in the same manner as in Example 1 except that the semicured thermosetting resin composition was replaced with a semi-cured thermosetting resin composition containing the following components.

| | |
|---|---|
| Solution of 25% of a polyamide resin ("Tohmide #1360, amine value = 5, supplied by Fuji Kasei Kogyo K.K.) in an isopropyl alcohol/toluene mixed solvent | 300 parts |
| Epoxy resin ("Epikote 828", supplied by Yuka Shell Epoxy K.K.) | 100 parts |
| Solution of 50% of a novolak phenolic resin ("CKM2432", supplied by Showa Kobunshi K.K.) in methyl ethyl ketone | 30 parts |
| Solution of 1% of 2-methylimidazole in methyl ethyl ketone | 0.3 part |

The reinforcing materials for a semiconductor device, obtained in Examples 1 and 2 and Comparative Examples 1 to 4 were evaluated for the following properties.

1) Filling in lead-formed surface

The reinforcing material for a semiconductor device, having holes corresponding to device holes and inner lead portions and having such a size that the reinforcing material did not extend onto outer lead portions, was attached to the lead-formed surface of a TCP (inner lead 100 μm pitch, lead 100–300 μm pitch, outer lead 300 μm pitch) at 120° C. under a pressure of 1,000 kg/cm²G. Then, a copper foil as a reinforcing sheet was removed by etching, and the semi-cured thermosetting adhesive was observed to see whether or not it covered (or it was fully filled in) the lead-formed surface without any gaps or air bubbles.

2) Peeling of adhesive from TCP and foaming during the step of curing

The reinforcing material for a semiconductor device was attached to the lead-formed surface of a TCP in the same manner as in the above procedure 1), and then, the laminate was heat-treated at 150° C. for 2 hours for completely curing the semi-cured thermosetting adhesive. After the heat treatment, the laminate was observed to see whether or nor the reinforcing sheet peeled due to the distortion of the TCP. Then, a reinforcing sheet was removed by etching, and the cured adhesive was observed to see whether or not it had foaming caused by the heat treatment.

Table 1 shows the results.

TABLE 1

|  | Covering | Peel | Foaming |
|---|---|---|---|
| Example 1 | Excellent | No | No |
| Example 2 | Excellent | No | No |
| CEx. 1 | Excellent | Yes | Yes |
| CEx. 2 | Defective | No | No |
| CEx. 3 | Excellent | Yes | Yes |
| CEx. 4 | Excellent | Yes | Yes |

Notes: CEx. = Comparative Example
"Yes" means that peeling or foaming existed, and "No" means that peeling or foaming did not exist.

As is clear in Table 1, the semi-cured thermosetting adhesive and the reinforcing material according to the present invention have excellent properties required for producing a TCP having a reinforcing sheet. Further, the semi-cured thermosetting adhesive of the present invention was cured by heat treatment and tested to show that it had solder reflow heat resistance at 260° C.

As explained above, the present invention can provide an adhesive for a semiconductor device and a reinforcing material, which can fully cover the lead-formed surface of a TCP at a working temperature lower than 150° C. at which a tin plating formed on the lead-formed surface is not affected, and which is free from the peeling of the TCP and foaming during the heat treatment. That is, when the reinforcing material of the present invention is used with a TCP, the TCP is free from the distortion or deflection caused by an external force. That is, a TCP having a reinforcing sheet can be produced while preventing the heat-induced deformation to a minimum level.

What is claimed is:

1. A reinforcing material for a tape carrier package used for forming a semiconductor device, the reinforcing material being a reinforcing sheet formed of a metal foil to be laminated on a lead-formed surface of the tape carrier package, the reinforcing sheet formed of a metal foil having an adhesive layer to bond the said sheet to the lead-formed surface, the adhesive layer being composed of a composition containing 100 parts by weight of a polyamide resin, 9 to 88 parts by weight of an epoxy resin and 5 to 60 parts by weight a phenolic resin, the polyamide resin having an amine value of 3.0 to 50.

2. A reinforcing material according to claim 1, wherein the polyamide resin is an aliphatic polyamide or an aromatic polyamide.

3. A reinforcing material according to claim 1, wherein the polyamide resin has a weight average molecular weight of 2,000 to 150,000 and a softening temperature of 50° to 180° C.

4. A reinforcing material according to claim 1, wherein the resin composition further contains an imidazole compound.

5. A reinforcing material according to claim 4, wherein the imidazole compound is incorporated in an amount of 0.03 to 10 parts by weight per 100 parts by weight of the epoxy resin.

6. A reinforcing material according to claim 1, wherein the adhesive composition further contains an elastomer.

7. A reinforcing material according to claim 1, wherein the adhesive composition further contains an inorganic filler or an organic filler in an amount of 5 to 95 parts by weight per 100 parts by weight of the adhesive composition.

* * * * *